United States Patent [19]
Nishi

[11] Patent Number: 5,793,474
[45] Date of Patent: Aug. 11, 1998

[54] EXPOSURE APPARATUS WHEREIN A WAFER CONTACT PORTION OF A MOVABLE STAGE INCLUDES LINEAR RIDGES

[75] Inventor: Kenji Nishi, Yokohama, Japan

[73] Assignee: Nikon Corporation, Tokyo, Japan

[21] Appl. No.: 533,933

[22] Filed: Sep. 26, 1995

[30] Foreign Application Priority Data

Sep. 30, 1994 [JP] Japan .................. 6-236766

[51] Int. Cl.$^6$ .................. G03B 27/42; G03B 27/58
[52] U.S. Cl. .................. 355/72; 355/53
[58] Field of Search .................. 355/53, 72, 73

[56] References Cited

U.S. PATENT DOCUMENTS

| | | | |
|---|---|---|---|
| 4,737,824 | 4/1988 | Sakai et al. | 355/53 |
| 5,177,528 | 1/1993 | Koromegawa et al. | 355/53 |
| 5,563,683 | 10/1996 | Kamiya | 355/53 |
| 5,572,288 | 11/1996 | Mizutani | 355/53 |

*Primary Examiner*—R. L. Moses
*Assistant Examiner*—Shival Virmani
*Attorney, Agent, or Firm*—Shapiro and Shapiro

[57] ABSTRACT

A plurality of ridge-shaped contact portions are formed on a wafer holder to extend in a direction parallel to the scanning direction, and chucking grooves for chucking the lower surface of a wafer are formed on these contact portions. The lower surface of the wafer is pushed up by movable members which are vertically movably arranged in the Z direction between the contact portions, thereby correcting any curve of the wafer in the transverse direction. Alternatively, the curve of the wafer is corrected by adjusting the pressure in a space defined by adjacent contact portions and the wafer.

41 Claims, 8 Drawing Sheets

DIRECTION OF SCANNING

DIRECTION OF SCANNING

DIRECTION OF SCANNING

DIRECTION OF SCANNING

EXPOSURE APPARATUS WHEREIN A WAFER CONTACT PORTION OF A MOVABLE STAGE INCLUDES LINEAR RIDGES

BACKGROUND OF THE INVENTION

1. Field of the Invention

The present invention relates to a scanning exposure apparatus for continuously exposing a pattern on a mask onto a photosensitive substrate by synchronously scanning the mask and the photosensitive substrate in predetermined directions and, more particularly, to an apparatus which is suitably applied to a step-and-scan type projection scanning exposure apparatus which moves each shot area to the scanning start position by stepping a photosensitive substrate, and thereafter, exposes a mask pattern onto the shot area by a scanning exposure method.

2. Related Background Art

In the manufacture of semiconductor elements, liquid crystal display elements, or the like in the photolithography process, an exposure apparatus for exposing a pattern on a photomask (a reticle or the like) onto each shot area on a wafer (or a glass plate) coated with a photosensitive material is used. As an exposure apparatus of this type, a so-called step-and-repeat type exposure apparatus (e.g., a stepper) which repeats an operation for stepping a wafer stage on which a wafer is placed, and successively exposing a pattern on a reticle onto each of shot areas on the wafer is popularly used.

FIG. 7 shows the schematic arrangement of a conventional stepper type projection exposure apparatus. Referring to FIG. 7, exposure illumination light IL from an illumination optical system AL illuminates a circuit pattern on a reticle 101 held by a reticle holder 102, and light transmitted through the reticle 101 reaches the surface of a wafer 104 via a projection optical system 103, thus forming an image of the pattern on the reticle 101 on the wafer 104. A photoresist is coated on the wafer 104, and the circuit pattern on the reticle 101 is projected and exposed onto the photoresist. Assume that a Z axis is defined in a direction parallel to the optical axis, AX, of the projection optical system 103, a Y axis is defined in a direction perpendicular to the plane of the drawing of FIG. 7 in a plane perpendicular to the Z axis, and an X axis is defined in a direction parallel to the plane of the drawing of FIG. 7 in the plane perpendicular to the Z axis.

The wafer 104 is held by vacuum chucking on a wafer holder 105 on a wafer stage 106. A movable mirror 107 is fixed at a predetermined end portion of the wafer stage 106, and the position of the wafer stage 106 is measured by a laser interferometer 113 arranged near the wafer stage 106, and the movable mirror 107. The wafer stage 106 is movable in the X-and Y-directions perpendicular to the optical axis AX by a driving system (not shown). The circuit pattern on the reticle 101 is exposed and transferred onto the entire surface of the wafer 104 by a so-called step-and-repeat method for moving each of the shot areas on the wafer 104 to the exposure position via the wafer stage 106, and repetitively performing an exposure in units of shot areas.

FIG. 8A is an enlarged plan view of the wafer holder 105 shown in FIG. 7, FIG. 8B is a sectional view taken along a line 8B—8B in FIG. 8A, and FIG. 8C is a partial enlarged view of FIG. 8B. As shown in FIG. 8A, contact portions 110a to 110e defined by a plurality of concentric projections which contact the lower surface of the wafer 104 to hold it are formed on the upper surface of the circular wafer holder 105 from the outer peripheral portion of the wafer holder to its central portion. A plurality of concentric chucking grooves 108a to 108e for vacuum-chucking the wafer 104 are formed along substantially the central portions of these contact portions 110a to 110e. Exhaust holes 112a and the like, which are connected to an external vacuum pump, are formed at some places of the bottom portions of the chucking grooves 108a to 108e (see FIG. 8C). Since a plurality of flat portions 109a to 109e between the adjacent contact portions 110a to 110e, and a flat portion 114 outside these contact portions do not contact the wafer 104, the contact area between the wafer holder 105 and the wafer 104 can be reduced.

Referring to FIG. 8B, the chucking groove 108a formed on the outermost contact portion 110a forms a closed structure when the upper surface of the contact portion 110a is in tight contact with the lower surface of the wafer 104. In this state, when the interior of the chucking groove 108a is set in a vacuum state, the wafer 104 is chucked on the wafer holder 105.

As described above, the conventional projection exposure apparatus such as a stepper uses the wafer holder having concentric contact portions. In this case, the surface of a wafer may be curved (or warped) or distorted via various processes. When the surface of the wafer is curved or distorted, it becomes difficult to adjust the surface of the wafer with respect to the imaging surface of the projection optical system within the range of the focal depth. In the conventional stepper, however, since the exposure field is relatively narrow, the surface of the wafer can be adjusted to the imaging surface without arranging any correction mechanism to the wafer holder.

However, recently, in order to cope with an increase in area of a chip pattern of, e.g., a semiconductor element, without increasing the size of the projection optical system, for example, a slit-scan type scanning exposure apparatus for continuously exposing a large pattern image on a reticle onto a wafer by synchronously scanning the reticle and the wafer has received a lot of attention. When such a scanning exposure apparatus utilizes the above-mentioned wafer holder having concentric contact portions, it is difficult to adjust the wafer surface to the imaging plane on the entire surface of a wide shot area to be subjected to a scanning exposure.

Note that the wafer surface does not match the imaging surface mainly in cases shown in FIGS. 9A and 9B. FIG. 9A shows an example wherein a curvature of the imaging plane has occurred due to aberrations of the projection optical system, and FIG. 9B shows an example wherein the surface of the wafer is curved. In FIG. 9A, a surface S1 of a wafer (wafer surface) maintains flatness since it is not distorted or tilted, but a curvature of an imaging surface F1 has occurred. For this reason, at points other than points P1 and P2 where the imaging surface F1 matches the surface S1 of the wafer, errors are generated in the imaging positions, and the obtained image becomes unclear. On the other hand, in FIG. 9B, an imaging surface F2 is free from any curvature and is flat, but a surface S2 of a wafer is curved. For this reason, at points other than points P3 and P4 where the imaging surface F2 matches the surface S2 of the wafer, errors are generated in the imaging positions, and the obtained image becomes unclear. Therefore, a wafer holder which can match the surface of the wafer and the imaging surface to each other is demanded.

SUMMARY OF THE INVENTION

The present invention has been made in consideration of the above situation, and has as its object to provide a scanning exposure apparatus which can easily match the wafer surface and the imaging surface to each other within the range of the focal depth on the entire surface of a wide shot area, while meeting the need for an increase in size of the shot area.

According to the present invention, in a scanning exposure apparatus which illuminates a mask (12) formed with a transfer pattern (MP) with light, and continuously exposes the pattern (MP) on the mask (12) onto a photosensitive substrate (5) by synchronously scanning the mask (12) in a first scanning direction (+Y direction) and the photosensitive substrate (5) in a second scanning direction (−Y direction) corresponding to the first scanning direction via a movable stage (2, 23), a contact portion of the movable stage (2, 23) with the photosensitive substrate (5) is defined by a plurality of linear ridges (24a–24i) extending in a direction parallel to the second scanning direction.

In this case, it is preferable that a height distribution adjustment member for adjusting the height distribution of the photosensitive substrate in a direction (X direction; to be referred to as a transverse direction hereinafter) perpendicular to the second scanning direction of the photosensitive substrate (5) placed on the plurality of linear ridges (24a–24i) be arranged on the movable stage (2, 23).

An example of the height distribution adjustment member is constituted by movable members (31a, 31b) which are vertically movably arranged between adjacent ones of the plurality of linear ridges (24a–24i) on the movable stage (2, 23), and driving members (34a, 34b) for vertically moving the movable members.

Another example of the height distribution adjustment member is constituted by a pressure varying member (35a, 42, 43) for adjusting the pressure of a gas in at least one space defined by the plurality of linear ridges (24a–24i) on the movable stage (2, 23) and the photosensitive substrate (5).

According to the scanning exposure apparatus of the present invention, since the contact portion between the movable stage (2, 23) and the photosensitive substrate (5) is defined by the plurality of linear ridges (24a–24i) extending in the direction parallel to the scanning direction (Y direction), a height variation of the photosensitive substrate (5) can be basically eliminated in the scanning direction as compared to a movable stage having the conventional concentric contact portions. Furthermore, in the transverse direction (X direction) perpendicular to the scanning direction, the photosensitive substrate (5) tends to curve downward. However, the curved state can be easily corrected since it is uniform. Therefore, the surface of the photosensitive substrate (5) and the imaging surface can be easily matched with each other within the range of the focal depth on the entire surface of a wide shot area on the photosensitive substrate (5). Furthermore, when the height distribution adjustment member for adjusting the height distribution of the photosensitive substrate (5) in the transverse direction is arranged on the movable stage (2, 23), the curved state of the photosensitive substrate (5) in the transverse direction can be precisely corrected.

Basically, in the scanning exposure apparatus, the dimension, in the scanning direction, of the slit-like exposure region is small, and upon scanning of the exposure mask (12) and the photosensitive substrate (5), the photosensitive substrate (5) can be adjusted to the imaging surface by measuring the focus position (height) and the tilt angle of the surface of the photosensitive substrate (5). For this reason, the surface of the photosensitive substrate matches the imaging surface with higher precision in the scanning direction. However, since a simultaneous exposure is performed in the longitudinal direction of the exposure region (transverse direction), focusing errors due to a curve of the photosensitive substrate (5) and a curvature of field of the imaging surface cannot be eliminated in this direction.

However, in the present invention, since the contact portions extend in the direction parallel to the scanning direction, and the height distribution adjustment member is arranged, any curve of the photosensitive substrate (5) can be easily corrected basically in the transverse direction. Furthermore, when the ridge-like contact portions (24a–24i) are arranged immediately under street lines (also called scribe lines or dicing lines) for dividing shot areas on the photosensitive substrate (5), if foreign matter such as dust becomes attached to each contact portion (24a–24i) on the movable stage (2, 23), the surface, above the foreign matter, of the photosensitive substrate (5) projects upward, but the intense-curvature portion (a projection on the surface of the photosensitive substrate due to the clamped foreign matter) of the photosensitive substrate (5) does not directly influence the transfer precision of the circuit pattern since it is located above the contact portion (24a–24i), i.e., above the street line outside the circuit pattern. On the other hand, when the ridge-like contact portions (24a–24i) are arranged immediately under the street lines, as shown in, e.g., FIG. 3C, that portion of the photosensitive substrate (5) which is located between one contact portion (24a) and the next contact portion (24b) belongs to a single shot area. Thus, the lateral displacement amount of the pattern image in the shot area due to any curve of the substrate can be further eliminated by adjusting the projection magnification of the pattern on the mask (12) onto the corresponding shot area.

As described above, the feature in that focusing errors can be eliminated in the transverse direction is very effective when a scanning exposure apparatus which can widen the shot area is adopted. More specifically, since the scanning exposure method uses a rectangular (or arcuated) exposure region which is short in the scanning direction, a circular effective exposure region (37) defined by the projection optical system can be utilized over a wider range in the transverse direction than a stepper type exposure method, as shown in, e.g., FIG. 4A.

Let M and L be the dimensions, in the scanning direction and the transverse direction, of a rectangular exposure region (36) in the scanning exposure method, and F be the length of one side of a square exposure region in the stepper method indicated by a broken line in FIG. 4A. In the case of the scanning exposure method, an exposure region which is larger by (L−F) in the transverse direction than the exposure region F×F in the stepper method can be utilized. Also, since the scanning length can be arbitrarily set in the scanning direction, the exposure range can be advantageously widened.

However, in order to utilize the above-mentioned feature of the scanning exposure apparatus, a variation in displacement between the surface of the photosensitive substrate (5) and the imaging surface of the projection optical system must be reduced in the transverse direction, and according to the present invention, a wide shot area of the scanning exposure apparatus can be effectively utilized.

When the height distribution adjustment member is constituted by movable members (31a, 31b) which are vertically movably arranged between adjacent ones of the plurality of linear ridges (24a–24i), and driving members (34a, 34b) for vertically moving the movable members, the photosensitive substrate (5) can be pushed up by a relatively simple arrangement, thus correcting the height distribution of the photosensitive substrate (5) in a short response time.

On the other hand, when the height distribution adjustment member is constituted by the pressure varying member (35a, 42, 43) for adjusting the pressure of a gas in at least one space defined by the plurality of linear ridges (24a–24i) on the movable stage (2, 23) and the photosensitive substrate (5), any curve of the photosensitive substrate (5) can be smoothly corrected as a whole in the transverse direction. In this case, when the photosensitive substrate (5) is curved in a concave shape, the pressure of the gas is increased; when the photosensitive substrate (5) is curved in a convex shape, the pressure is set to be a negative pressure. In this manner, both the concave and convex curves of the photosensitive substrate (5) can be corrected.

BRIEF DESCRIPTION OF THE DRAWINGS

FIGS. 6A to 6C show a scanning exposure apparatus according to another embodiment of the present invention, in which FIG. 6A is an enlarged plan view of principal portion of a wafer holder, FIG. 6B is a sectional view taken along a line 6B—6B in FIG. 6A, and FIG. 6C is a partial enlarged view of FIG. 6B;

DETAILED DESCRIPTION OF THE PREFERRED EMBODIMENTS

An embodiment of a scanning exposure apparatus according to the present invention will be described below with reference to FIGS. 1 to 5C. In this embodiment, the present invention is applied to a slit-scan type projection exposure apparatus.

Figure 1:
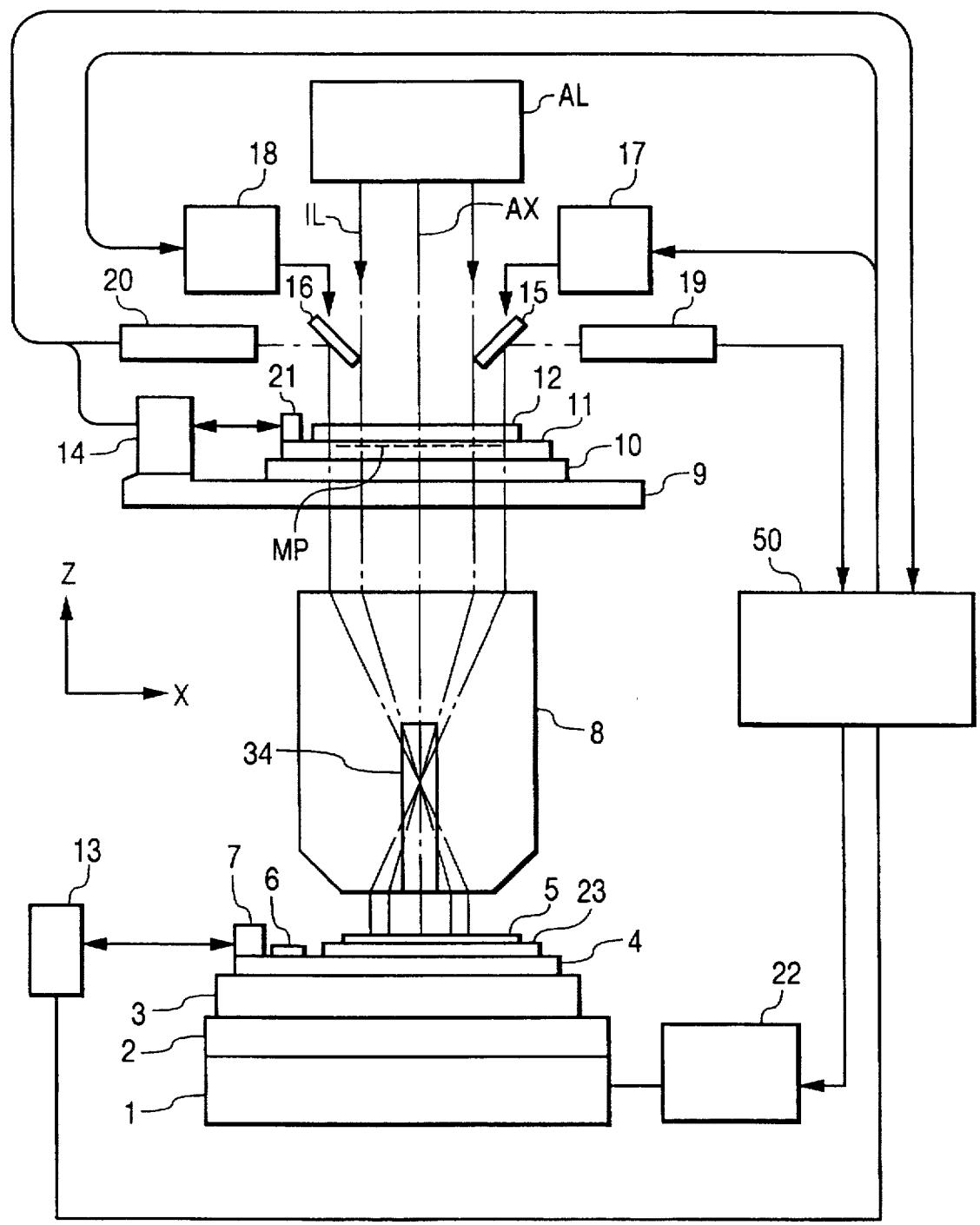
FIG. 1 is a view showing the arrangement of a scanning exposure apparatus according to an embodiment of the present invention.

FIG. 1 shows the arrangement of the exposure apparatus of this embodiment. Referring to FIG. 1, a circuit pattern MP on a reticle 12 is illuminated with illumination light IL from an illumination optical system AL, and the image of the pattern MP is projected onto a wafer 5 via a projection optical system 8. Note that a Z axis is defined in a direction parallel to the optical axis, AX, of the projection optical system 8, a Y axis is defined in a direction perpendicular to the plane of the drawing of FIG. 1 in a plane perpendicular to the Z axis, and an X axis is defined in a direction parallel to the plane of the drawing of FIG. 1 in the plane perpendicular to the Z axis.

Let $\beta$ be the projection magnification of the projection optical system 8. Then, when the circuit pattern MP on the reticle 12 is exposed onto the surface of the wafer 5, the reticle 12 is scanned at a constant velocity $V_R$ in a $-Y$ direction (or $+Y$ direction) perpendicular to the plane of the drawing of FIG. 1 with respect to a slit-like illumination region 36 (see FIG. 5A) formed by the illumination light IL, while the wafer 5 is scanned at a constant velocity $V_w$ ($=\beta \cdot V_R$) in the $+Y$ direction (or $-Y$ direction) perpendicular to the plane of the drawing of FIG. 1 in synchronism with the scanning operation of the reticle 12.

A reticle stage 10 is placed on a reticle base 9 to be movable in the scanning direction (Y direction). A reticle fine movement stage 11 is placed on the reticle stage 10 to realize fine, high-precision position control in the X direction, Y direction, and θ direction (rotation direction). The reticle 12 is held on the reticle fine movement stage 11. A movable mirror 21 is fixed on an end portion on the reticle fine movement stage 11. The positions, in the X and Y directions, of the reticle fine movement stage 11 are detected all the time by the movable mirror 21 and a laser interferometer 14 arranged on an end portion on the reticle base 9 at a resolution of, e.g., about 0.01 μm.

A wafer Y stage 2 is placed on a wafer base 1 to be movable in the scanning direction (Y direction), and a wafer X stage 3 is placed on the wafer Y stage 2 to be movable in the X direction. A Z leveling stage 4 which can attain fine movements in the Z and e directions and correction of the tilt angle is placed on the wafer X stage 3. The wafer 5 is vacuum-chucked on a wafer holder 23 placed on the Z leveling stage 4. The positions, in the X, Y, and e directions, of the Z leveling stage 4 are detected all the time with high precision by a movable mirror 7 arranged on an end portion on the Z leveling stage 4 and an externally arranged laser interferometer 13. Note that the wafer holder 23 will be described in detail later.

Furthermore, although not shown, in FIG. 1, an oblique incident type focal point position detection system constituted by an illumination optical system for projecting an image of a pinhole, a slit pattern, or the like obliquely with respect to the optical axis AX toward the exposure surface of the wafer 5 near the imaging surface of the projection optical system 8, and a light-receiving optical system for receiving a reflected light beam of the projected image by the surface of the wafer 5 via a slit is arranged. The position, in the Z direction, of the surface of the wafer 5 is detected by this focal point position detection system, and the Z leveling stage 4 is operated on the basis of the detection information, thus attaining auto-focusing control, so that the surface of the wafer 5 matches the imaging surface of the projection optical system 8.

Note that the position information, in the X, Y, and θ directions, of the Z leveling stage 4, and the position information thereof in the Z direction are respectively supplied from the laser interferometer 13 and the focal point position detection system to a control system 50, and the control system 50 controls the position of the Z leveling stage 4 (wafer 5) via a wafer driving system 22 on the basis of the input position information.

In order to establish the correspondence between the coordinate system of the wafer 5 measured by the laser interferometer 5 and the coordinate system of the reticle 12 measured by the laser interferometer 14, a reference mark 6 is arranged on the Z leveling stage 4, and alignment optical systems 19 and 20 which simultaneously observe the reference mark 6 and reticle marks on the reticle 12 to establish the correspondence between the coordinate systems of the reticle 12 and the wafer 5 are arranged above the reticle 12. Also, deflection mirrors 15 and 16 for guiding illumination light from the alignment optical systems 19 and 20 toward the reticle marks in the alignment mode, and mirror driving systems 17 and 18 for retracting the exposure mirrors 15 and 16 in the exposure mode are arranged.

Furthermore, an off-axis type alignment device 34 is arranged on the side surface portion of the projection optical system 8. On the wafer 5, wafer marks (not shown) for the alignment device 34 are formed. By detecting the positions of the wafer marks using the alignment device 34, the wafer 5 can be aligned with higher precision.

The arrangement of the wafer holder 23 will be described in detail below with reference to FIGS. 2A to 2C.

Figure 2A:
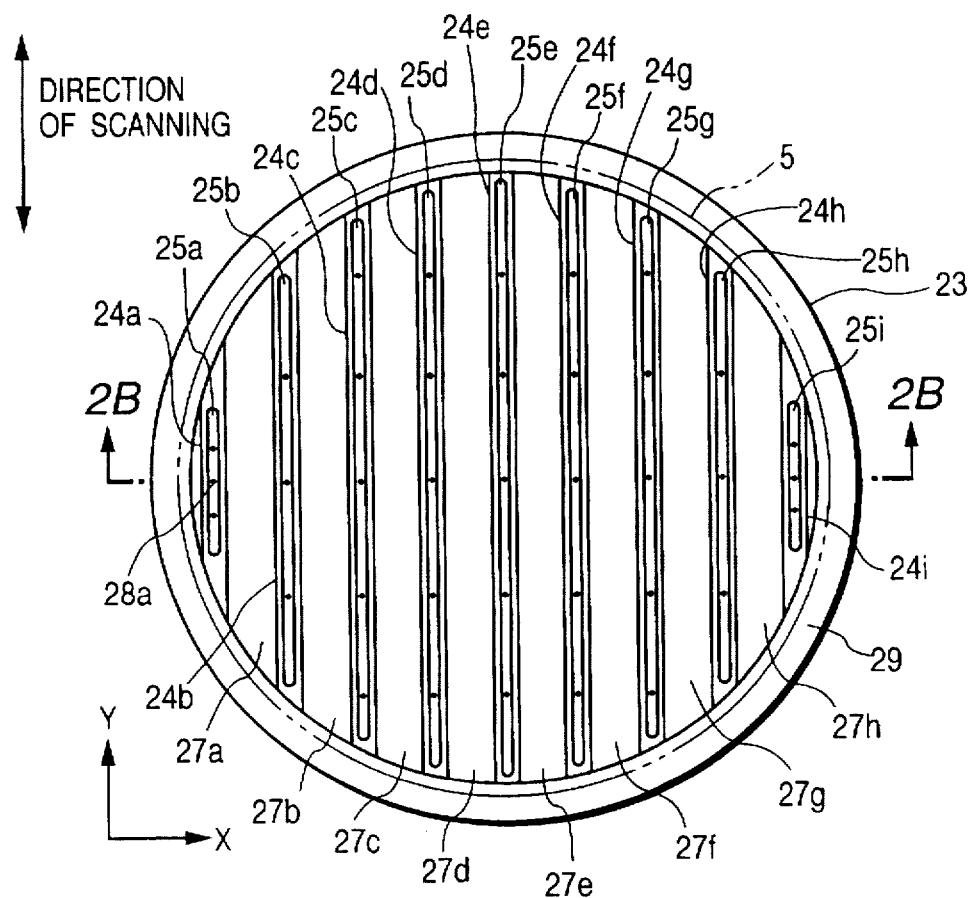
FIG. 2A is an enlarged plan view showing the arrangement of a wafer holder shown in FIG. 1.
Figure 2B:
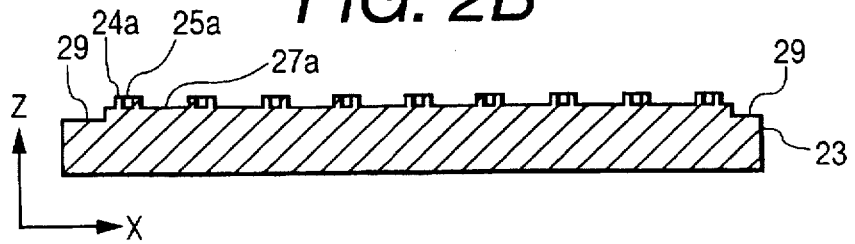
FIG. 2B is a sectional view taken along a line 2B—2B in FIG. 2A.
Figure 2C:
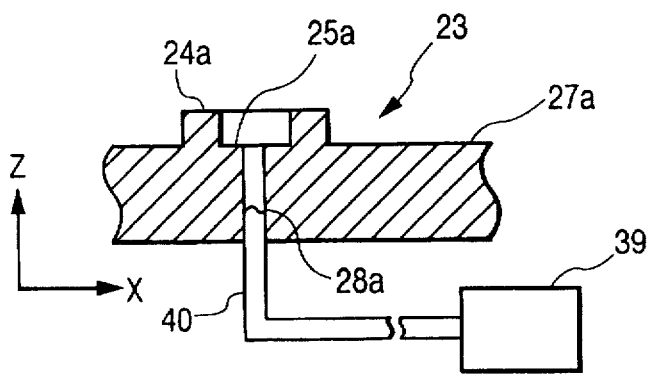
FIG. 2C is a partial enlarged view of FIG. 2B.

FIG. 2A is an enlarged plan view of the wafer holder 23 shown in FIG. 1, FIG. 2B is a sectional view taken along a line 2B—2B in FIG. 2A, and FIG. 2C is a partial enlarged sectional view of FIG. 2B. As shown in FIG. 2A, on the upper surface of the circular wafer holder 23, a plurality of linear, ridge-like contact portions 24a to 24i are arranged in turn from a position near the end portion in the −X direction to extend in a direction parallel to the scanning direction (i.e., the Y direction). These contact portions 24a to 24i contact the lower surface of the wafer 5 to hold it. The contact portions 24a to 24i are formed adjacent to each other at an interval which substantially agrees with that between adjacent street lines between shot areas, parallel to the scanning direction, on the wafer 5. Furthermore, in this embodiment, the wafer 5 is placed on the wafer holder 23, so that the contact portions 24a to 24i are located immediately under the street lines of the wafer 5 and extend in a direction parallel to the street lines.

Chucking grooves 25a to 25i are formed at the central portions of the contact portions 24a to 24i, respectively. The chucking grooves 25a to 25i form closed spaces with the lower surface of the wafer 5, and chuck the wafer 5 on the wafer holder 23 by setting the interiors of the grooves at a negative pressure. The two ends, in the scanning direction, of each of these chucking grooves 25a to 25i are closed to form a closed space with the lower surface of the wafer 5.

Exhaust holes for gas suction (to be described later) are formed at some places of the bottom portions of the chucking grooves 25a to 25i. Flat portions 27a to 27h which do not contact the wafer are formed between the adjacent chucking grooves 25a to 25i. These flat portions 27a to 27h are formed to reduce the contact area between the wafer holder 23 and the wafer 5. Furthermore, an outer peripheral portion 29 is formed by notching the outer peripheral portion of the wafer holder 23. The inner diameter of the outer peripheral portion 29 is set to be slightly smaller than that of the wafer 5 indicated by a two-dashed line in FIG. 2A.

The arrangement around the contact portions 24a to 24i and the chucking grooves 25a to 25i formed on the contact portions 24a to 24i will be described below. Note that the contact portions 24a to 24i, the chucking grooves 25a to 25i, and the flat portions 27a to 27h respectively have different lengths in the scanning directions, but they have the same arrangements. For this reason, only the outermost set of a contact portion, chucking groove, and flat portion on the wafer holder 23 will be explained below with reference to FIGS. 2B and 2C.

Referring to FIG. 2B, the outermost chucking groove 25a is formed at substantially the central portion of the contact portion 24a which contacts the lower surface of the wafer 5, and chucks the wafer 5 on the wafer holder 23 by setting the space closed by the contact portion 24a and the wafer 5 at a negative pressure. As shown in FIG. 2C, an exhaust hole 28a is formed at substantially the central portion of the bottom portion of the chucking groove 25a, and a gas in the chucking groove 25a is drawn by suction by a vacuum device 39 via the exhaust hole 28a and a pipe 40.

Furthermore, a mechanism for correcting the distortion of the wafer 5 is arranged on the wafer holder 23. This mechanism will be described below with reference to FIGS. 3A to 3C.

Figure 3A:
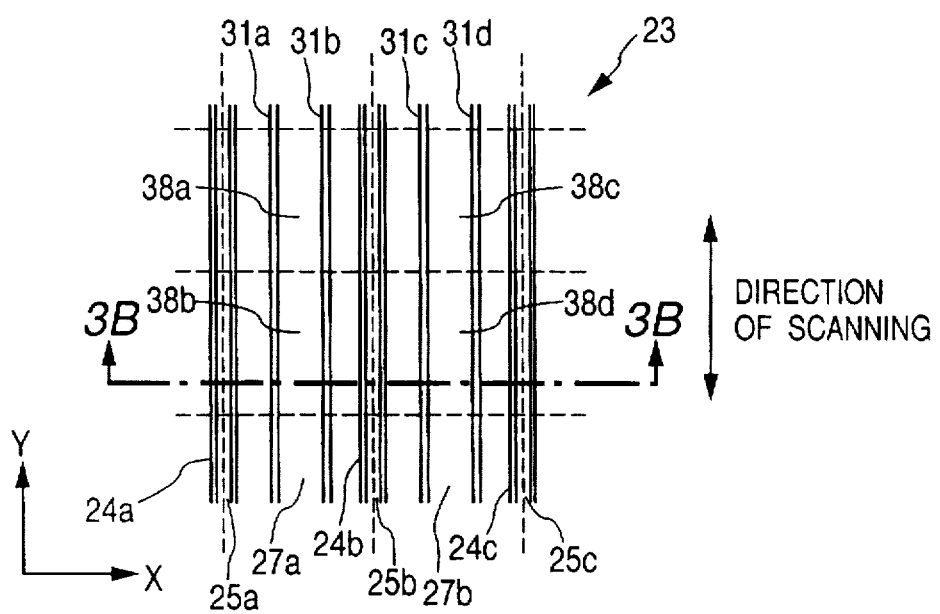
FIG. 3A is a partial enlarged plan view of the wafer holder shown in FIGS. 2A to 2C.
Figure 3B:
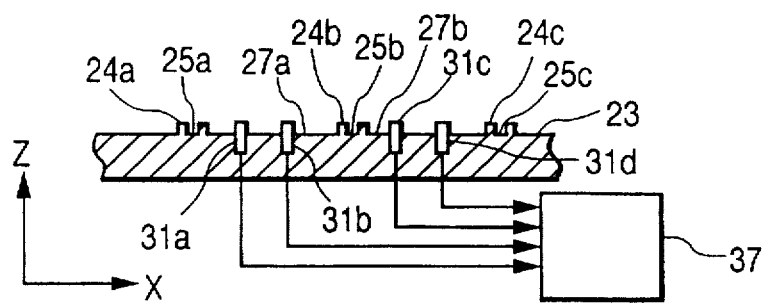
FIG. 3B is a sectional view taken along a line 3B—3B in FIG. 3A.
Figure 3C:
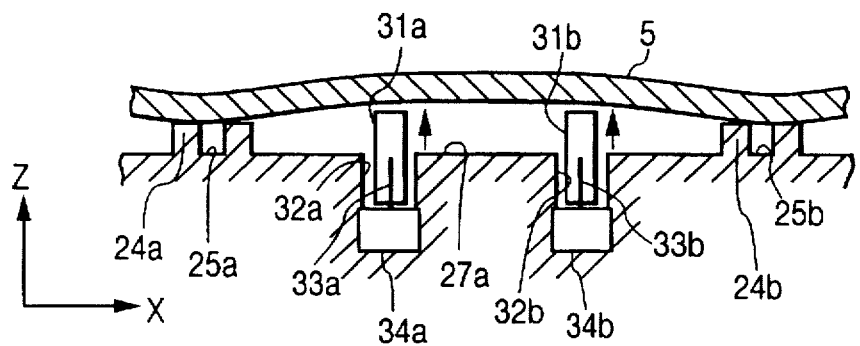
FIG. 3C is a partial enlarged view of FIG. 3B.

FIGS. 3A to 3C show an example of the mechanism for correcting the distortion of the wafer 5, in which FIG. 3A is a partial enlarged plan view of the wafer holder 23 shown in FIGS. 2A to 2C, FIG. 3B is a sectional view taken along a line 3B—3B in FIG. 3A, and FIG. 3C is a partial enlarged view of FIG. 3B.

Referring to FIG. 3A, planar movable members 31a and 31b which are driven vertically in the Z direction are arranged in the flat portion 27a between the contact portions 24a and 24b to extend in a direction substantially parallel to the contact portions 24a and 24b. Similarly, movable members 31c and 31d are arranged in the flat portion 27b between the contact portions 24b and 24c to extend in a direction substantially parallel to the contact portions 24b and 24c.

Note that the above-mentioned contact portions 24a to 24c are formed adjacent to each other at an interval which substantially agrees with that between adjacent street lines between shot areas, parallel to the scanning direction, on the wafer 5. The interval between the adjacent street lines agrees with the dimension, in the transverse direction (X direction), of each shot area to be exposed. As indicated by regions divided by broken lines in FIG. 3A, the movable members 31a to 31d are arranged at substantially the same intervals in the ranges, in the transverse direction, of shot areas 38a to 38d.

As shown in FIG. 3B, the movable members 31a to 31d are inserted in holes formed in the flat portions 27a and 27b of the wafer holder 23, and move vertically to correct the surface shape of the wafer 5. The movement of these movable members 31a to 31d is controlled by the control system 37.

FIG. 3C shows in detail the structure around the movable members 31a and 31b. As shown in FIG. 3C, the movable members 31a and 31b are respectively inserted in holes 32a and 32b which have rectangular openings elongated in the scanning direction on the surface of the wafer holder 23. The movable members 31a and 31b are respectively driven by driving elements 34a and 34b such as piezoelectric elements via driving shafts 33a and 33b arranged on their lower ends, and contact the lower surface of the wafer 5 to correct the surface shaft of the wafer 5 by pushing up the wafer 5 from its lower surface side. The same applies to the movable members 31c and 31d. The same movable members as the movable members 31a to 31d are arranged between other contact portions 24c to 24i.

The scanning exposure apparatus of this embodiment can change the loading position of the wafer holder 23 in correspondence with the shot arrangement, so that the contact portions 24a to 24i on the wafer holder 23 match the street lines on the wafer 5.

The operation of the scanning exposure apparatus of this embodiment will be described below with reference to FIGS. 4A to 4C and FIGS. 5A to 5C.

Figure 4A:
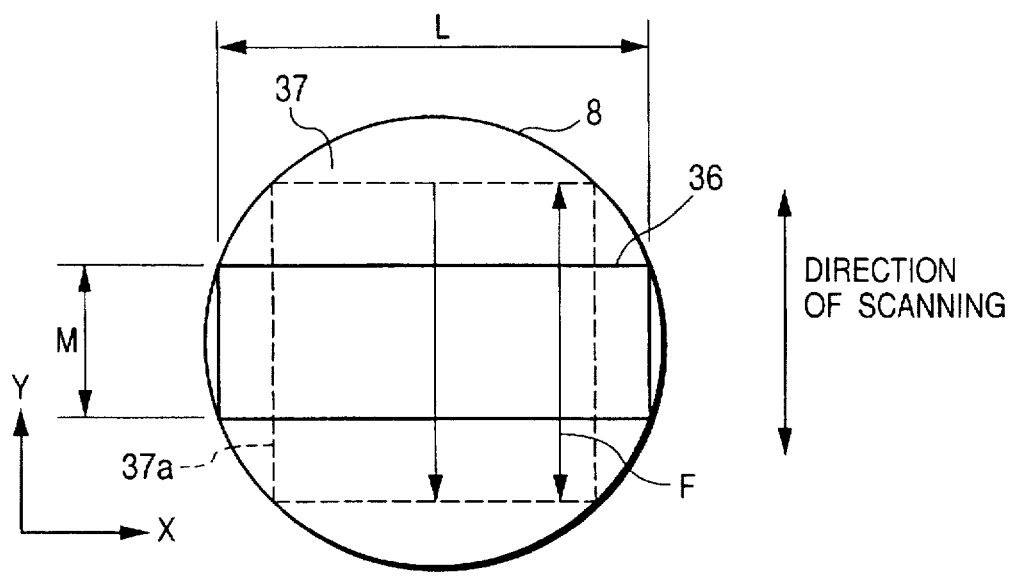
FIGS. 4A to 4C are views showing the relationship between the imaging surface corresponding to an exposure region, and the wafer surface.
Figure 4B:
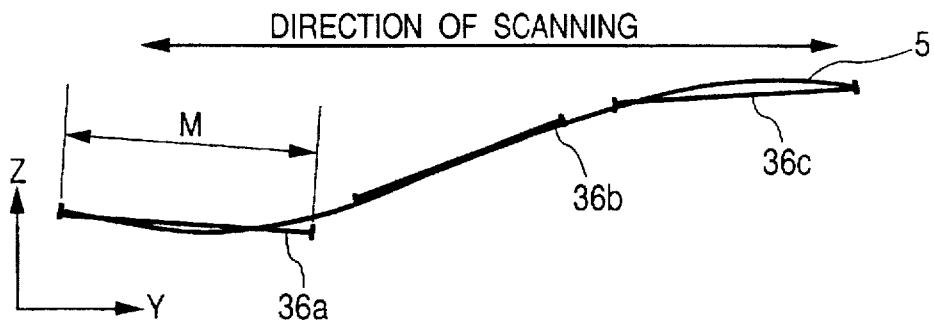
Figure 4C:
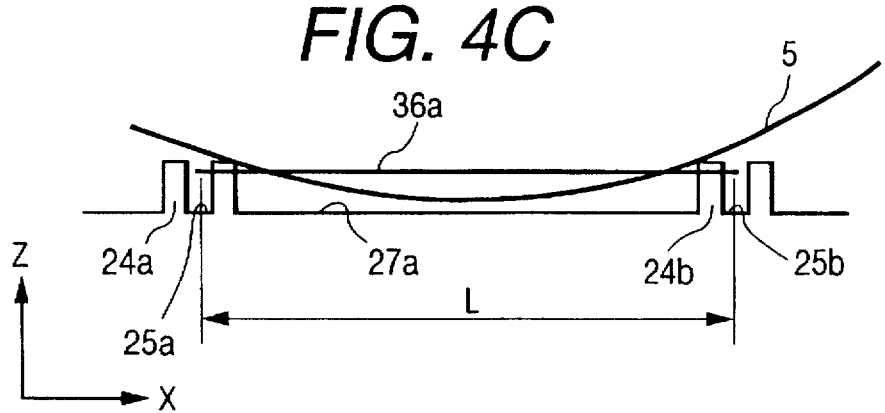

FIG. 4A is a plan view for explaining the scanning exposure region of the scanning exposure apparatus of this embodiment, FIG. 4B is a side view showing the relationship between the imaging surface and the wafer surface in the scanning direction, and FIG. 4C is a side view showing the relationship between the imaging surface and the wafer surface in the transverse direction (i.e., a direction perpendicular to the scanning direction). Referring to FIG. 4A, an exposure is performed by scanning the wafer 5 in FIG. 1 in the +Y direction (or −Y direction) with respect to a slit-like exposure region 36 having a dimension M in the scanning direction and a dimension L in the transverse direction, in a circular effective exposure field 37 of the projection optical system 8. A conventional exposure region 37a having a dimension F in both the scanning and transverse directions, as indicated by a broken line in FIG. 4A, can only assure an F×F area as an exposure region for one shot area. However, in the case of the scanning exposure method used in this embodiment, the shot area can be widened in the scanning direction by scanning the wafer 5 in the direction of an arrow in FIG. 4A relative to the L×M exposure region 36. If the scanning length is represented by S, a shot area having a size of S×L can be exposed in a single scan.

FIG. 4B shows the relationship between the wafer 5 and the imaging surface corresponding to the exposure region 36 in this scan when viewed from the X direction. As shown in FIG. 4B, the surface, serving as the imaging surface, of the wafer 5 is distorted in the height direction, and as the imaging surface corresponding to the exposure region 36 moves in the scanning direction, the imaging surface is displaced from the surface of the wafer. In this case, the varying height position of the distorted surface of the wafer 5 is measured by the above-mentioned focal point position detection system, and an operation is performed by the reticle fine movement stage 11 or the Z leveling stage 4 via the control system 37, so that the surface of the wafer 5 matches the imaging surface like an imaging surface 36a, 36b, or 36c. Since the dimension M, in the scanning direction, of the exposure region 36 is short, the magnitude of the surface distortion of the wafer 5 within the exposure region does not become so large, and the surface of the wafer 5 can substantially match the imaging surface in the scanning direction.

However, when this state is observed from the Y direction, as shown in FIG. 4C, since the exposure range is wide in the transverse direction, the imaging surface 36a cannot be matched with the three-dimensional surface of the wafer 5, and a large displacement is generated between the surface of the wafer 5 and the imaging surface 36a. However, in this embodiment, since the contact portions extending in the scanning direction are arranged, as described above, and the lower surface of the wafer is pushed up by the movable members arranged between adjacent contact portions, the displacement, in the Z direction, between the imaging surface and the wafer surface can be basically reduced in the transverse direction as compared to the conventional method.

Furthermore, in the arrangement of this embodiment, the contact portions 24a and 24b are located at the two ends of the imaging surface 36a. The two ends of the imaging surface 36a correspond to the two ends, in the transverse direction, of the exposure region 36.

Figure 5A:
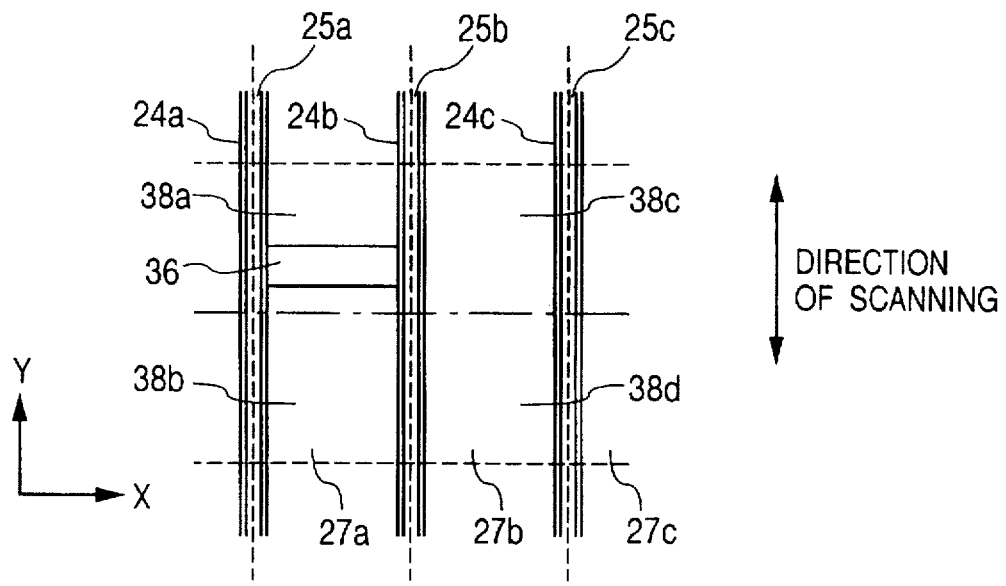
FIG. 5A is an enlarged plan view showing the relationship between contact portions, with the wafer, on the wafer holder shown in FIG. 1, and street lines between shot areas on the wafer.
Figure 5B:
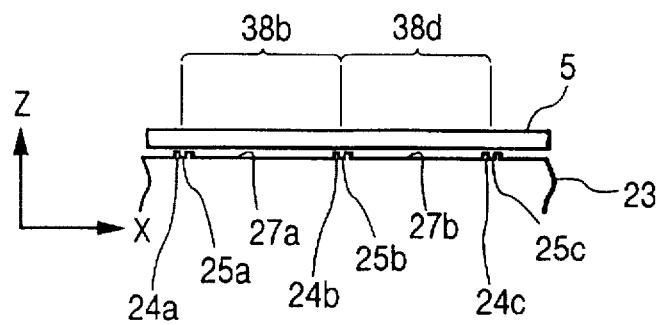
FIG. 5B is a side view of FIG. 5A.
Figure 5C:
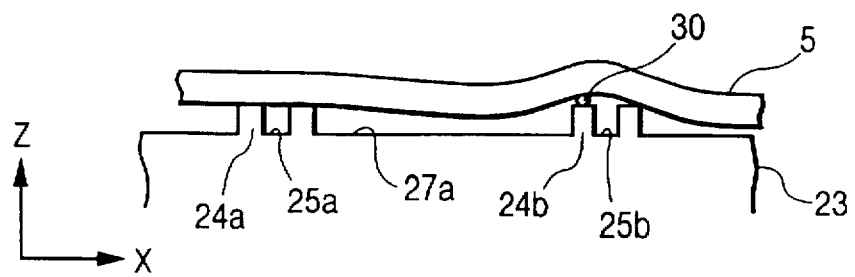
FIG. 5C is a partial enlarged view of FIG. 5B.

FIG. 5A is a plan view showing the relationship between the shot area to be exposed and the contact portions, FIG. 5B is a side view of FIG. 5A, and FIG. 5C is a partial enlarged view of FIG. 5B to explain the operation performed when foreign matter becomes attached to the contact surface. Note that the movable members are not shown in FIGS. 5A to 5C.

Referring to FIG. 5A, for example, the contact portions 24a and 24b are formed at an interval which is substantially equal to the dimension, in the transverse direction, of the shot area 38a or 38b divided by broken lines. As shown in FIG. 5B, the two ends, in the transverse direction, of the shot areas 38b and 38d are located at the central portions of the contact portions 24a and 24b, respectively. The shot area 38a or 38b is an area scanned by the exposure region 36 in a single scan. Therefore, as described above, according to this embodiment, the contact portions are located at the two ends of the imaging region. The same applies to other contact portions and shot areas.

When foreign matter 30 becomes attached between the wafer holder 23 with the above-mentioned arrangement and the wafer 5 and on the surface of the contact portion 24b of the wafer holder 23, as shown in, e.g., FIG. 5C, the surface, above the foreign matter 30, of the wafer 5 projects upward. In this case, the intense-curvature portion of the wafer 5 is located above the contact portion 24b, and is located on a street line between the exposure ranges on the wafer 5 in this embodiment. Since a portion of the wafer 5 between portions contacting the contact portions 24a and 24b corresponds to a shot area, the expansion/contraction amount, in the transverse direction, of the pattern image can be further corrected by adjusting, e.g., the projection magnification of the projection optical system 8.

In this embodiment, as shown in FIGS. 3A to 3C, the mechanism for forcibly correcting any curve of the wafer 5 is arranged. For example, the movable members 31a and 31b arranged in the flat portion 27a are vertically driven by the driving elements 33a and 33b arranged at their end portions. For example, when a portion of the wafer 5 above the flat portion 27a is recessed from the surface portion above the contact portion 24a or 24b in FIG. 3C, the recess on the wafer 5 can be corrected by pushing up the corresponding portion from the lower surface side of the wafer 5 by the movable members 31a and 31b. When a portion of the wafer 5 above the flat portion 27a projects from the surface portion above the contact portion 24a or 24b, it cannot be corrected by the movable members 31a and 31b. Chucking grooves for vacuum-chucking the wafer may be formed on the upper surface (the contact surfaces with the wafer) of the movable members 31a and 31b and may be connected to a vacuum pump. With this arrangement, even when the wafer 5 projects from the contact portion 24a, in other words, even when a portion of the wafer 5 between the contact portions 24a and 24b projects upward, the movable members 31a and 31b are brought into contact with the lower surface of the wafer 5, and chuck the wafer 5 by setting the interiors of the chucking grooves at a negative pressure by the vacuum pump. Thereafter, the movable members 31a and 31b are moved downward. Thus, the surface of the wafer 5 can be made substantially flat.

A scanning exposure apparatus according to another embodiment of the present invention will be described below with reference to FIGS. 6A to 6C. In this embodiment, the arrangement of the wafer holder 23 described in the above embodiment is modified. The same reference numerals in FIGS. 6A to 6C denote portions corresponding to those in FIGS. 3A to 3C, and a detailed description thereof will be omitted.

Figure 6A:
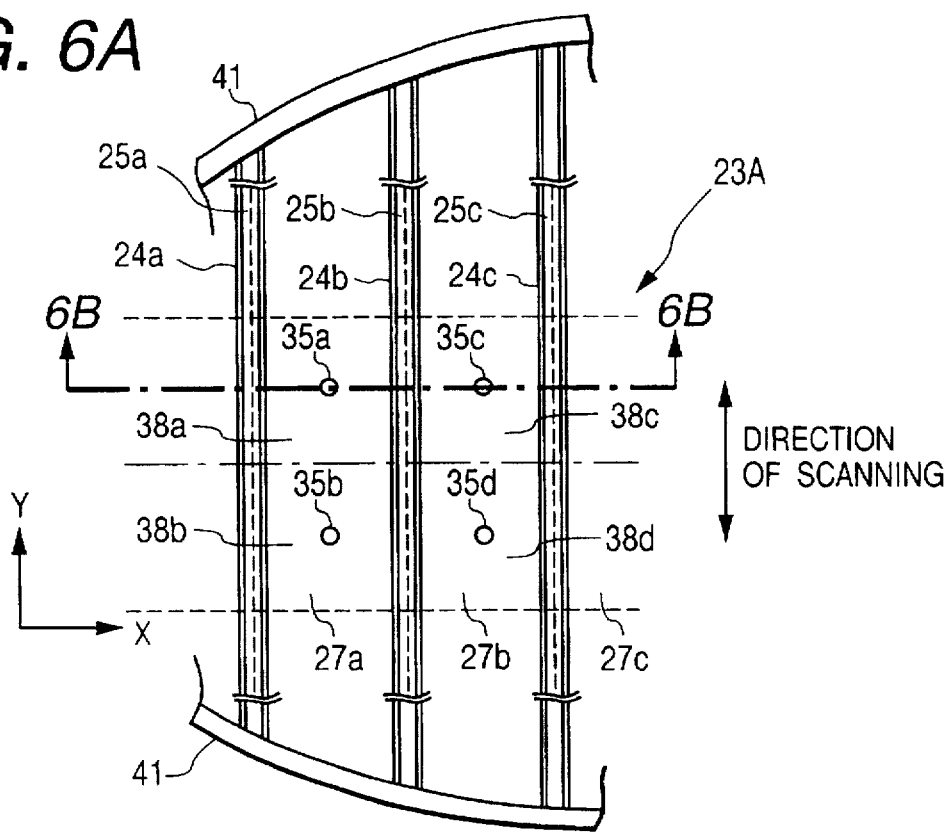
Figure 6B:
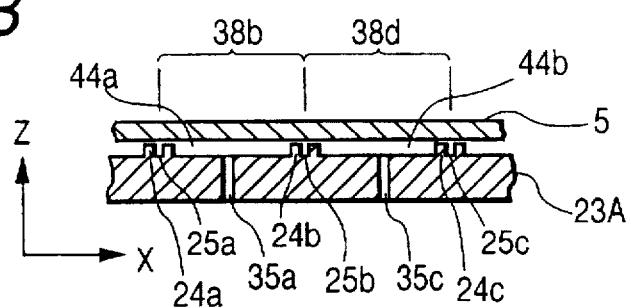
Figure 6C:
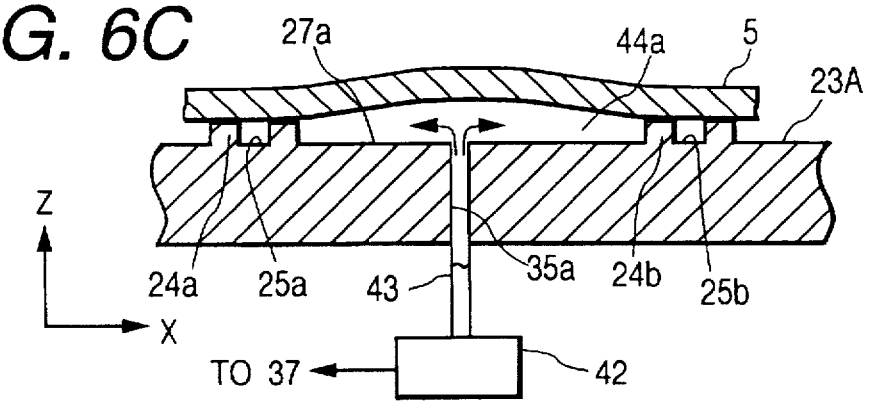
Figure 7:
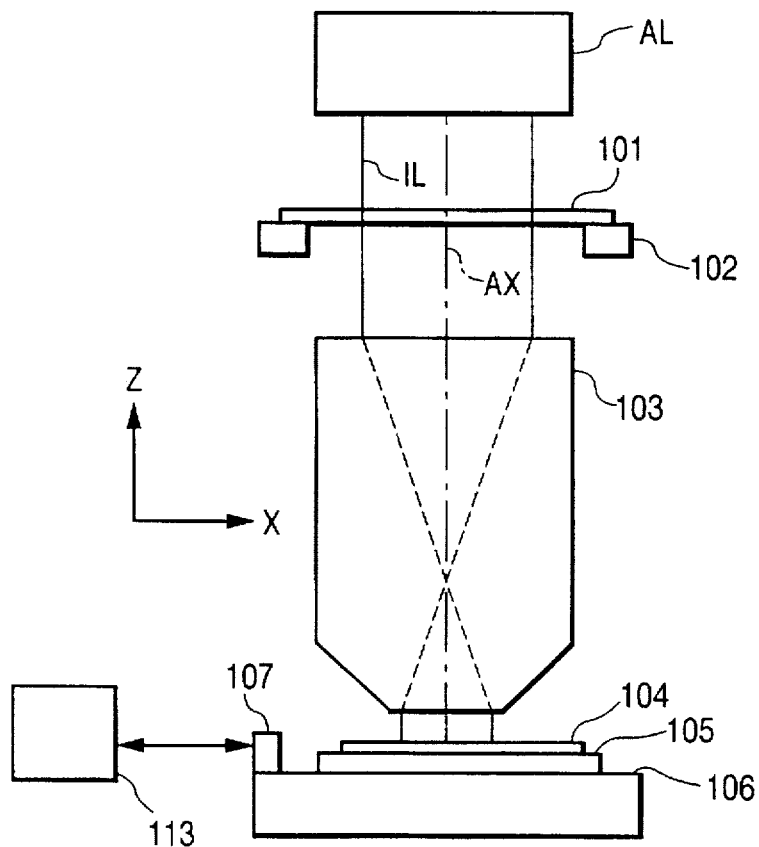
FIG. 7 is a view showing the arrangement of a conventional stepper type projection exposure apparatus.
Figure 9A:
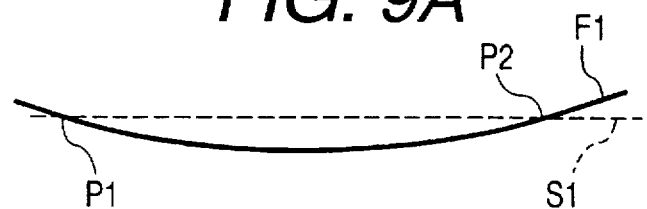
FIGS. 9A and 9B show displacements between the imaging surface and the wafer surface.
Figure 9B:
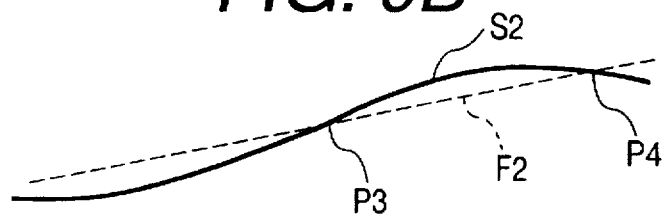
Figure 8A:
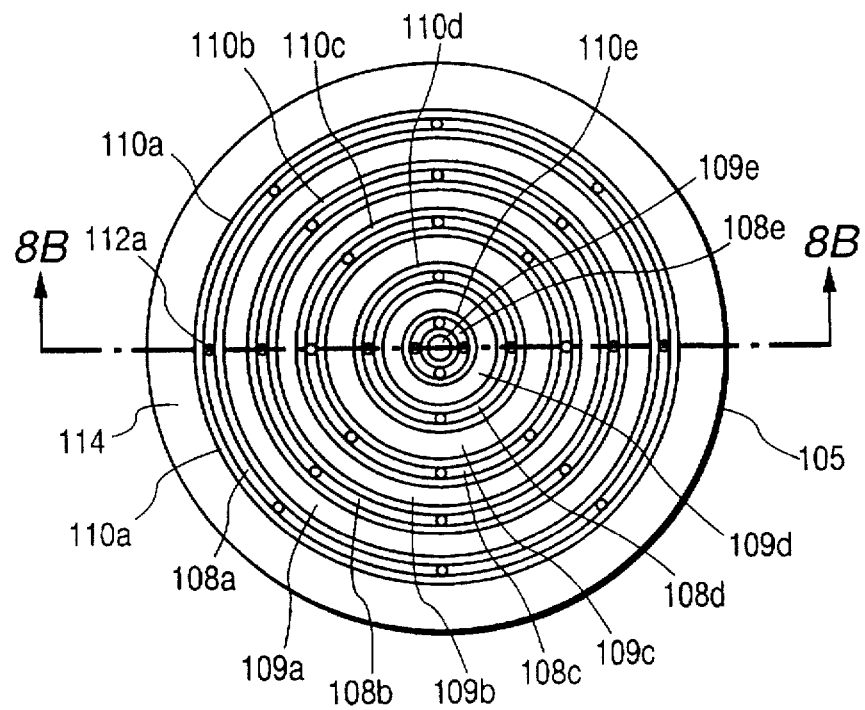
FIG. 8A is an enlarged plan view of a wafer holder shown in FIG. 7.
Figure 8B:
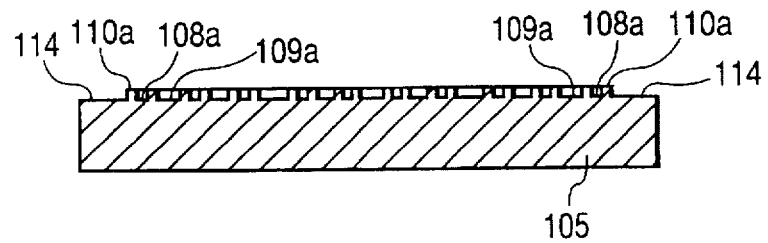
FIG. 8B is a sectional view taken along a line 8B—8B in FIG. 8A.
Figure 8C:
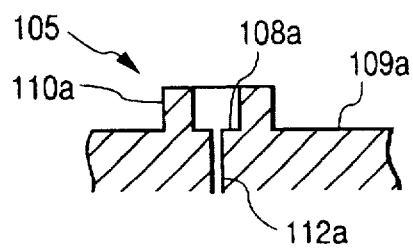
FIG. 8C is a partial enlarged view of FIG. 8B.

FIG. 6A is a partial plan view of a wafer holder 23A of this embodiment, FIG. 6B is a sectional view taken along a line 6B—6B in FIG. 6A, and FIG. 6C is a partial enlarged sectional view of FIG. 6B. As shown in FIG. 6A, pressure adjustment holes 35a to 35d are formed at substantially the central portions of shot areas 38a to 38d on a wafer holder 23A. The outer circumferential portion of the wafer holder 23A is surrounded by a closing wall 41 having substantially the same height as that of the contact portions 24a to 24c.

As shown in FIG. 6B, the pressure adjustment holes 35a and 35c are respectively formed at substantially the central portion between the contact portions 24a and 24b, and substantially the central portion between the contact portions 24b and 24c to extend from the surface toward the bottom portion of the wafer holder 23A. The shapes and sizes of the pressure adjustment holes 35a to 35d are not particularly limited as long as these holes can attain the objective of this embodiment.

In this embodiment, any curve of the wafer 5 is corrected by adjusting the pressures in closed spaces 44a and 44b defined by the wall 41, the contact portions 24a to 24c, the lower surface of the wafer 5, and the flat portions 27a and 27b. The gas pressures in the defined closed spaces 44a and 44b are adjusted by supplying/removing a gas by a pressure adjustment device 42 via the pressure adjustment hole 35a and a pipe 43, as shown in FIG. 6C. The pressure adjustment device 42 adjusts the pressure in the closed space 44a on the basis of a command from the control system 37 for controlling the positional relationship between the surface of the wafer 5 and the imaging surface of the projection optical system 8. More specifically, the gas pressure in the closed space is adjusted to prevent the wafer 5 from being pushed up by the contact portion 24a or 24b due to, e.g., too high a pressure in the closed space 44a.

The arrangement of a portion of the wafer holder 23A of this embodiment has been described. However, the wafer holder 23A has an arrangement similar to that of the above embodiment as a whole.

According to this embodiment, correction in the transverse direction can be performed not only in a case wherein the surface of the wafer 5 is recessed but also in a case wherein the surface of the wafer projects upward. More specifically, when an exposure shot portion on the wafer 5 is recessed, the pressure adjustment device 42 increases the pressures in the closed spaces 44a and 44b; when the exposure shot portion projects upward from the contact portion, the device 42 decreases the pressures in the closed spaces 44a and 44b, thus correcting the curve of the wafer 5.

In this embodiment, a projection exposure apparatus is used as the exposure apparatus. However, the scanning exposure apparatus of this embodiment is effective not only for a projection type apparatus but also for a proximity type scanning exposure apparatus. In the above description, the present invention is applied to the arrangement for independently driving the reticle and wafer. Alternatively, the present invention may be applied to a scanning exposure apparatus in which a reticle and wafer are placed on a single movable column and are integrally moved, thus obtaining the same effect as described above.

In each of the above embodiments, the interval, in the transverse direction, between the two contact portions for supporting the wafer 5 is substantially equal to the interval, in the transverse direction, between the adjacent street lines for dividing a plurality of shot areas on the wafer 5. For this reason, when the size of each shot area on the wafer, i.e., the interval between the adjacent street lines is changed, the wafer holder 23 may be exchanged accordingly.

The contact portions on the wafer holder 23 are constituted by linear ridges which continuously extend in a direction parallel to the scanning direction (Y direction) of the wafer. Alternatively, the contact portions need not always be formed continuously. For example, a plurality of circular or quadrangular prism-shaped projections may be aligned along the scanning direction.

As described above, the present invention is not limited to the above-mentioned embodiments, and various changes and modifications may be made without departing from the scope of the invention.

According to the scanning exposure apparatus of the present invention, since the ridge-like contact portions on the movable stage (wafer holder), which contact the lower surface of the photosensitive substrate (wafer) are arranged in a direction parallel to the scanning direction, any curve of the photosensitive substrate can be basically eliminated in the scanning direction, and the photosensitive substrate is uniformly curved in the transverse direction. Thus, the curve can be easily corrected. For this reason, the displacement between the imaging surface and the surface of the photosensitive substrate due to the curve of the photosensitive substrate in the transverse direction can be eliminated. Therefore, good imaging performance can be maintained even on an exposure region which is wide in the transverse direction like in the scanning exposure apparatus, and a wide exposure region can be effectively utilized.

When the contact portions of the movable stage, which contact the lower surface of the photosensitive substrate are designed to match the street lines on the photosensitive substrate, even when foreign matter becomes attached to the contact portion, a portion of the photosensitive substrate, which contacts the contact member on which the foreign matter is attached corresponds to a street line, and does not influence the precision of the pattern image on the photosensitive substrate. Also, the lateral displacement between the photosensitive substrate and the imaging surface caused by foreign matter can be corrected by changing the magnification of, e.g., a projection optical system by, e.g., the internal pressure adjustment of the projection optical system, or by moving at least one optical element (e.g., a lens element closest to the reticle) of the projection optical system in the optical axis direction.

When the height distribution adjustment member for adjusting the height distribution of the photosensitive substrate in the transverse direction perpendicular to a second scanning direction of the photosensitive substrate placed on the plurality of linear ridges is arranged on the movable stage, the height of the distorted surface on the photosensitive substrate can be arbitrarily changed in the transverse direction, and focusing errors in the transverse direction can be eliminated.

When the lower surface of the photosensitive substrate is moved vertically, a pattern in the shot area is displaced laterally due to the difference between the expansion/contraction amounts of the lower and upper surfaces of the photosensitive substrate. Therefore, conversely, the height distribution adjustment member generates a lateral displacement in correspondence with the distortion of the projection optical system, thus eliminating the distortion.

When the height distribution adjustment member is constituted by movable members which are vertically movably arranged between a plurality of linear ridges on the movable stage and driving members for vertically moving the movable members, the recessed height distribution on the photosensitive substrate can be corrected with a relatively simple arrangement and in a short response time.

When the height distribution adjustment member is constituted by a pressure varying member for adjusting the pressure of a gas in at least one space defined by the plurality of linear ridges on the movable stage and the photosensitive substrate, any curve of the photosensitive direction can be smoothly corrected as a whole in the transverse direction, and not only a recess but also a projection of the photosensitive substrate can be easily corrected in the transverse direction.

What is claimed is:

1. In a scanning exposure apparatus which illuminates a mask formed with a transfer pattern, and exposes the pattern on the mask onto a photosensitive substrate by synchronously scanning the mask in a first direction and the photosensitive substrate via a movable stage in a second direction corresponding to the first direction, the improvement characterized by that a contact portion of the movable stage with the photosensitive substrate is constituted substantially entirely by a plurality of linear ridges which extend in a direction parallel to the second direction.

2. An apparatus according to claim 1, wherein a height distribution adjustment member for adjusting a height distribution, in a direction perpendicular to the second direction, of the photosensitive substrate placed on said plurality of linear ridges is arranged on the movable stage.

3. An apparatus according to claim 2, wherein said height distribution adjustment member is constituted by a movable member which is vertically movably arranged between said plurality of linear ridges on the movable stage, and a driving member for vertically moving said movable member.

4. An apparatus according to claim 2, wherein said height distribution adjustment member is constituted by a pressure varying member for adjusting a pressure of a gas in at least one space defined by said plurality of linear ridges on the movable stage, and the photosensitive substrate.

5. An apparatus according to claim 1, wherein grooves which communicate with a vacuum source to chuck the photosensitive substrate are formed on said linear ridges.

6. A scanning exposure apparatus comprising:

a mask stage for holding a mask formed with a pattern to be transferred;

a movable stage for holding a photosensitive substrate, the movable stage having a contact portion that contacts and supports the photosensitive substrate, the contact portion being constituted substantially entirely by a plurality of linear ridges extending in a predetermined direction;

an optical system for illuminating a portion of said pattern on the mask so as to expose the pattern on the mask onto said photosensitive substrate; and a scanning device for moving said movable stage in synchronism with said mask in said predetermined direction so as to scanningly expose said photosensitive substrate.

7. An apparatus according to claim 6, wherein a height distribution adjustment member for adjusting a height distribution, in a direction perpendicular to the second direction, of the photosensitive substrate placed on said plurality of linear ridges is arranged on the movable stage.

8. An apparatus according to claim 7, wherein said height distribution adjustment member is constituted by a movable member which is vertically movably arranged between said plurality of linear ridges on the movable stage, and a driving member for vertically moving said movable member.

9. An apparatus according to claim 7, wherein said height distribution adjustment member is constituted by a pressure varying member for adjusting a pressure of a gas in at least one space defined by said plurality of linear ridges on the movable stage, and the photosensitive substrate.

10. An apparatus according to claim 6, wherein grooves which communicate with a vacuum source to chuck the photosensitive substrate are formed on said linear ridges of the movable stage.

11. A scanning exposure apparatus comprising:

a scanning system for synchronously moving a mask and a photosensitive substrate to expose the photosensitive substrate with an image of a pattern on the mask; and a device arranged in said scanning system and adapted to support the photosensitive substrate by a contact portion constituted substantially entirely by a plurality of linear ridges extending substantially along a scanning direction of the photosensitive substrate.

12. An apparatus according to claim 11, wherein said plurality of linear ridges are aligned at substantially the same interval as an interval, in a direction perpendicular to the scanning direction, between lines for dividing a plurality of small areas, exposed with the image of the pattern, on the photosensitive substrate.

13. An apparatus according to claim 11, further comprising:

a member arranged in said support device and adapted to adjust a surface position of the photosensitive substrate between said plurality of linear ridges.

14. A substrate supporting apparatus comprising:

a device supporting a photosensitive substrate with linear ridges, wherein substantially all linear ridges that support said substrate are substantially parallel with a same linear direction.

15. An exposure apparatus including a substrate supporting apparatus according to claim 14 and a projection optical system, wherein said exposure apparatus transfers a pattern of a mask via said projection optical system onto the photosensitive substrate supported on said substrate supporting apparatus.

16. An exposure apparatus according to claim 15, and which is constructed to move said mask and said photosensitive substrate synchronously to transfer the pattern onto the photosensitive substrate by scanning exposure, and said direction coincides with a direction of a scanning axis of said mask and said photosensitive substrate.

17. A substrate supporting apparatus comprising:

a device supporting a circular substrate with a plurality of linear ridges, wherein said linear ridges are substantially parallel to a diameter of said circular substrate.

18. A substrate supporting apparatus according to claim 17, wherein opposite ends of the respective linear ridges are disposed substantially on a circle.

19. A substrate supporting apparatus according to claim 17, wherein said linear ridges constitute all linear ridges of said device that support said circular substrate.

20. An exposure apparatus including a substrate supporting apparatus according to claim 17 and a projection optical system, wherein the exposure apparatus transfers a pattern of a mask via said projection optical system onto the photosensitive substrate supported on said substrate supporting apparatus.

21. A substrate supporting apparatus comprising:

a device supporting a photosensitive substrate with a plurality of linear ridges, wherein said linear ridges are substantially parallel to a street line which divides a plurality of exposure regions of said photosensitive substrate onto which a pattern is to be transferred.

22. A substrate supporting apparatus according to claim 21, wherein said linear ridges are positioned to match with street lines of said photosensitive substrate.

23. An exposure apparatus including a substrate supporting apparatus according to claim 21 and a projection optical system, wherein the exposure apparatus transfers a pattern of a mask via said projection optical system onto the photosensitive substrate supported on said substrate supporting apparatus.

24. An exposure method comprising:

supporting a photosensitive substrate on linear ridges, with substantially all linear ridges that support said photosensitive substrate being substantially parallel to a same direction; and transferring a pattern of a mask onto said photosensitive substrate thus supported, through a projection optical system.

25. An exposure method according to claim 24, wherein said transferring includes synchronously moving said mask and said photosensitive substrate along said direction so as to transfer said pattern onto said photosensitive substrate by scanning exposure.

26. An exposure method comprising:

supporting a circular substrate with a plurality of linear ridges which are substantially parallel with a diameter of said circular substrate; and transferring a pattern of a mask onto said circular substrate thus supported, through a projection optical system.

27. An exposure method according to claim 26, wherein opposite ends of the respective linear ridges are disposed substantially on a circle.

28. An exposure method according to claim 26, wherein said linear ridges constitute all linear ridges supporting said circular substrate.

29. An exposure method comprising:

supporting a photosensitive substrate with a plurality of linear ridges, such that the linear ridges are substantially parallel to a direction of a street line which divides a plurality of exposure regions of the photosensitive substrate onto which a pattern of a mask is to be transferred; and transferring the pattern of said mask onto said photosensitive substrate thus supported, through a projection optical system.

30. An exposure method according to claim 29, wherein said linear ridges are positioned to match with street lines of the supported photosensitive substrate.

31. An exposure method according to claim 29, wherein opposite ends of the respective linear ridges are disposed substantially on a circle.

32. A semiconductor device manufacturing method comprising:

transferring a pattern of a mask through a projection optical system onto a photosensitive substrate supported with linear ridges to manufacture a semiconductor device, wherein substantially all linear ridges supporting said photosensitive substrate are substantially parallel to a same linear direction.

33. A semiconductor device manufacturing method comprising:

transferring a pattern of a mask through a projection optical system onto a circular substrate supported with a plurality of linear ridges, which are substantially parallel with a diameter of said circular Substrate, to manufacture a semiconductor device.

34. A method according to claim 33, wherein said linear ridges are positioned to match with street lines of the supported substrate.

35. A method according to claim 33, wherein opposite ends of the respective linear ridges are disposed substantially on a circle.

36. A semiconductor device manufacturing method comprising:

transferring a pattern of a mask through a projection optical system onto a photosensitive substrate supported with a plurality of linear ridges, which are substantially parallel to a street line which divides a plurality of exposure regions on the photosensitive substrate, to manufacture a semiconductor device.

37. A method according to claim 36, wherein said linear ridges are positioned to match with street lines of the supported photosensitive substrate.

38. A method according to claim 36, wherein opposite ends of the respective linear ridges are disposed substantially on a circle.

39. A semiconductor device manufactured by a method according to claim 32.

40. A semiconductor device manufactured by a method according to claim 33.

41. A semiconductor device manufactured by a method according to claim 36.

* * * * *